Feb. 14, 1967 F. DOSTAL 3,303,705

ATTITUDE COMPENSATED ELECTROMECHANICAL OSCILLATOR

Filed March 19, 1964

INVENTOR.
FRANK DOSTAL
BY [signature]
ATTORNEY 3,303,705

ATTITUDE COMPENSATED ELECTROMECHANICAL OSCILLATOR

Frank Dostal, Elmhurst, N.Y., assignor to Bulova Watch Company, Inc., New York, N.Y., a corporation of New York Filed Mar. 19, 1964, Ser. No. 353,144
13 Claims. (Cl. 73—505)

This invention relates generally to electromechanical oscillators of the vibrating reed or tuning fork type, and more particularly to an oscillator of this type which incorporates means to compensate or overcompensate for frequency changes resulting from changes in attitude and acceleration, in order to stabilize the oscillator frequency or to vary the frequency as a function of said change.

The frequency stability of mechanical vibrating systems is generally superior to that of electrical oscillatory circuits operated in the same range. Where long-term stability, temperature stability and isochromism are required, the use of electrical oscillators is precluded, for such elements as capacitors, inductors and vacuum tubes lack these properties. For this reason, where an electrical or mechanical output of constant frequency is required, it is commonly the practice to make use of a tuned reed or tuning fork whose vibrations are sustained by means of an electromagnetic drive circuit or other means.

Such oscillators are now used as timekeeping sources, as disclosed, for example, in the patent to Hetzel, 2,971,-323, and as constant-frequency signal sources, as disclosed in the patent to Dostal, 2,707,234. There are, of course, many other applications for electromechanical oscillators, the present invention being useful wherever it is necessary to stabilize the frequency of the osecillator with respect to changes in attitude.

The tuning fork may be regarded as being an oscillatory reed of exceptionally high Q, with infinite inertia of the point of fixation, especially in the case of an elastically mounted fork having equal tine frequencies. Tuning fork masses do not move on a straight line, hence a fork undergoes a change in frequency in an acceleration field, whether due to motion or to gravity. The frequency of the fork is higher in the position where the tines extend downwardly, for gravity adds to the normal restoring elasticity in the tines. With the tines up, the gravity opposes the restoring forces and the fork rate becomes slower.

The largest change in fork rate arises when the fork attitude is changed from tines up to tines down. This change, in seconds per day, is expressed by the following formula:

$$\Delta t \approx \pm \frac{1.2}{L_{cm} F^2}$$

where $L_{cm}$ is the length of the tuning fork in centimeters; F is the frequency in kilocycles per second.

Where the oscillator fork is a timekeeping device incorporated in a wristwatch as disclosed in said Hetzel patent, the frequency should not be lower than 300 c.p.s., in order to avoid attitude errors larger than ±5 seconds a day, the fork being in this instance about 2.5 cm. long. Thus the higher the fork frequency, the less sensitive the fork to changes in attitude.

Accordingly, it is the principal object of the invention to provide an electromechanical oscillator which is compensated for changes in attitude and acceleration.

More specifically, it is an object of this invention to provide a tuning-fork watch with attitude compensating means which render the timepiece substantially insensitive to position changes, thereby improving the accuracy of the timepiece.

A significant feature of a tuning fork oscillator in accordance with the invention resides in a fork design which renders the oscillator substantially insensitive to shock and vibration.

Another object of the invention is to provide a tuning-fork oscillator which is grossly overcompensated for changes in attitude, to produce an output frequency which is a function of acceleration, thereby providing an accurate accelerometer in which acceleration is translated into frequency.

Still another object of the invention is to provide a tuning fork oscillator which is sensitive to change in attitude and which generates an output signal whose frequency is a function of attitude, thereby providing an accurate position or attitude indicator.

Briefly stated, these objects are accomplished in a tuning fork or vibrating reed oscillator in which the vibrating element is sustained in oscillation, and in which, attached by means of a spring to the end of the reed or tine is a weight, the weight being spaced from the tine or reed to a degree which varies as the mounting spring therefor flexes. This variation in spacing is a function of the attitude of the vibrating member and is in a direction which produces changes in vibratory rate opposed to the change normally encountered with a change in attitude.

For a better understanding of the invention, as well as other objects and further features thereof, reference is made to the following detailed description to be read in conjunction with the accompanying drawings, wherein.

Figure 1:
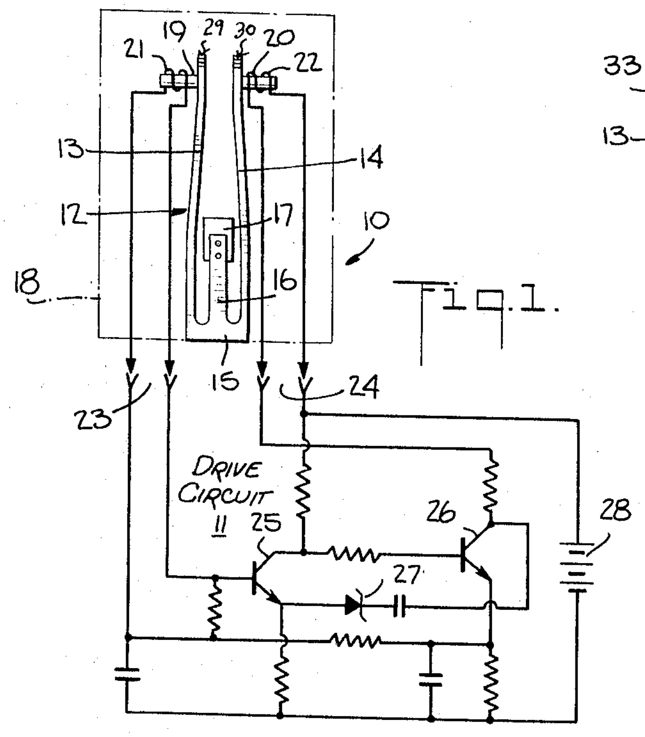
FIG. 1 is a schematic diagram of one form of electromechanical oscillator having attitude-compensating means in accordance with the invention.
Figure 2:
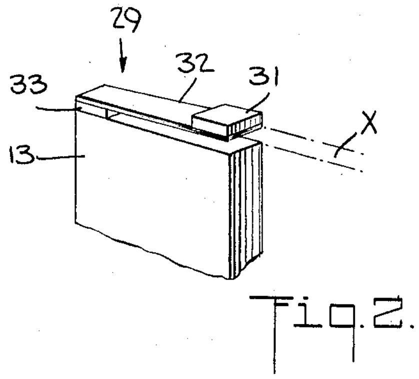
FIG. 2 is a perspective view of one tine of the fork shown in FIG. 1.

Referring now to FIGS. 1 and 2, there is shown an electromechanical oscillator having attitude-compensating elements in accordance with the invention, the oscillator comprising a tuning fork unit 10 and a drive circuit 11 therefor. The tuning fork 12 in the unit is constituted by a pair of flexible tines 13 and 14 interconnected by a relatively heavy base 15 having an upwardly-extending stem 16 disposed midway between the tines and attached to a supporting plate 17 within a suitable casing 18.

The tuning fork is a high "Q" mechanical oscillator which vibrates at a natural frequency determined by the dimensions of the tines and the loading thereon. In practice, the fork is formed of a metal having a low temperature coefficient of modulus of elasticity to render its frequency substantially insensitive to changes in ambient temperature.

The stem mounting M is so arranged that the moment of the upper end of the fork 10 is about equal to the moment of the lower end of the fork, thereby balancing out moments and rendering the fork substantially immune to shock and vibration.

Attached to tines 13 and 14 are permanent magnet plugs 19 and 20, respectively, the plugs reciprocating within fixed coils 21 and 22. Each coil and plug combination forms an electromagnetic transducer, coil 22 acting as a drive coil and coil 21 as a pick-up coil. Coil 21 is connected through connectors 23 to the base input circuit of a first transistor 25 in the drive circuit, while coil 22 is connected through connectors 24 to the output collector circuit of the second transistor 26 of a two-stage amplifier energized by battery 28.

The circuit of the two transistors provides a positive feedback between the pick-up and drive coils, whereby impulses produced by movement of plug 19 within pick-up coil 21, are amplified and applied to drive coil 22 to actuate the plug 20, thereby exciting the fork into motion. The amplifier voltage is stabilized by means of a zener diode 27. The drive means forms no part of the present invention, and any known means to drive a fork or reed may be used within the context of the invention.

Attached to the ends of tines 13 and 14 are attitude-compensator elements 29 and 30, respectively. Each element, as shown separately in FIG. 2, is constituted by a weight 31 mounted at one end of a flat spring 32, the other end thereof being secured to a pedestal 33 affixed to the end of the tine 13 adjacent one side thereof. For greatest efficiency, the center of gravity of the magnet at one end of the tine is located from the center line of the fork the same distance as the center of rotation is located from the center line.

The frequency of each tine is determined by the effective length thereof, and this length is varied by flexing of spring 32, so that the spacing X between the weight and the end of the tine is varied accordingly. When the tine is upwardly positioned, the force of gravity on the weight causes the spring to bend, thereby moving the weight closer to the tine. This tends effectively to shorten the length of the tine to raise its operating frequency. In the absence of the compensator, the fork with the tines extending upwardly, tends to vibrate at a slower frequency, as noted previously. Hence by a proper choice of compensator parameters, the increase in fork frequency resulting from the UP position of the fork on the compensator, may be made to balance out the decrease in frequency normally encountered in this position.

Similarly, when the fork is in its down position, the spring-mounted weight of the compensator tends under the force of gravity to move downwardly away from the end of the tine, thereby effectively lengthening the tine and decreasing its operating frequency to an extent balancing out the increase normally encountered at this position. For attitudes intermediate the up and down positions, the relative shift in weight is such as to effect appropriate compensation therefor.

It is important that the stiffness of the spring be correlated to the mass of the weight so as to avoid resonance effects, for proper operation of the compensator is possible only when the weight at any given attitude is stationary relative to its tine. For this purpose, a stiff spring may be combined with a heavy weight, or a limber spring with a light weight, or intermediate combinations may be used, as long as the resultant combination is non-resonant. In the case of tuning forks, in order that both tines operate at the same frequency, one must place a compensator on each tine, although in some instances a practical compromise may be effected with a compensator on one tine only. But for vibrating reeds, a single compensator is all that is necessary.

The principles disclosed above are applicable to normal forks with uniform tines as well as to forks whose tines have non-uniform sections, and to weighted forks.

In an actual embodiment, a 400-cycle fork 2 inches long, with .05 inch thick tines, operating at a frequency of 400 cycles with a normal error of 35 parts in a million between the tines in the UP attitude, and the tines in the down attitude, was compensated in the manner described above so that the resulting error for any attitude was less than 3 parts in a million.

Figure 3:
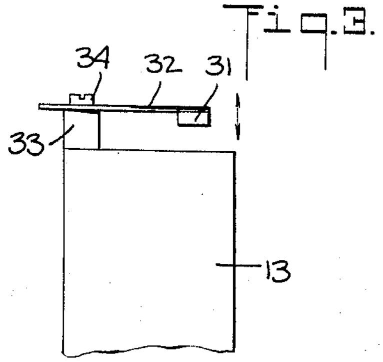
FIG. 3 shows in elevational view, an attitude-compensator for a fork, wherein the position of the compensator is adjustable.

Referring now to FIG. 3, there is shown an arrangement for adjusting the response of the compensator to changes in attitude. This is accomplished by providing a longitudinal slot 32*a* in spring 32, and affixing the spring to the pedestal 33 by means of a set screw 34, whereby the position of weight 31 relative to its pivot point may be adjusted to obtain the desired degree of deflection. It will be noted that the weight in this instance, lies under the spring.

Figure 5:
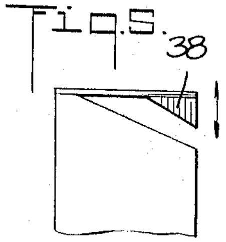
FIG. 5 shows in elevation a compact form of attitude compensator.

In FIG. 5, a more compact arrangement is shown, in which the end of the tine is chamfered and in which the weight 38 is triangular rather than block-shaped, whereby the space between the weight and the chamfered edge is uniform.

Figure 6:
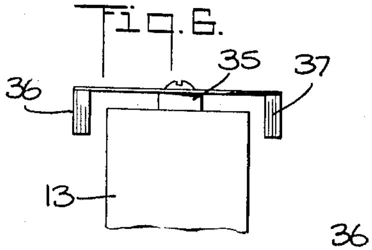
FIG. 6 is an elevational view of a twin form of attitude compensator for a vibratory reed or tine.
Figure 4:
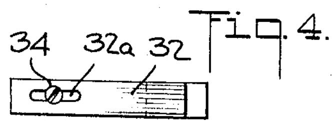
FIG. 4 shows the same compensator in plan view.
Figure 7:
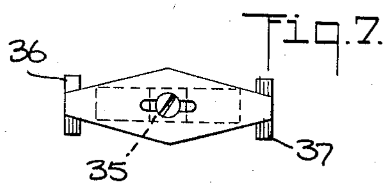
FIG. 7 is a plan view of said twin compensator.

In FIGS. 6 and 7, a twin or symmetrical compensator is illustrated wherein the pedestal 35 is centered on the tine 13 and supports a spring having weights 36 and 37 on either end thereof, so that the weights are balanced relative to the tine, rather than asymmetrically disposed, as in FIG. 2.

Figure 8:
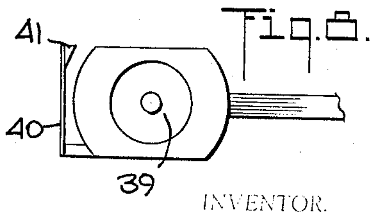
FIG. 8 is a compensator arrangement which attaches to the magnetic drive element of a fork.

In FIG. 8, the tine has a cup-shaped magnetic element 39 attached to the end thereof, this element being of the type disclosed in the above-identified Hetzel patent. The compensator therefor, in the form of a spring 40, and a weight 41 is attached to the cup element to thereby vary the overall length of the tine and cup.

In the above-described compensator, the structure is arranged to produce a change in the frequency of the vibrating element which counterbalances and cancels out the change resulting from a change in attitude, thereby stabilizing the oscillator. By arranging the compensator to overshoot or to grossly overcompensate, the electromechanical oscillator then becomes highly sensitive to the force of acceleration, particularly along its axis, and it therefore acts as an accelerometer. Thus the voltage produced in the drive circuit shown in FIG. 1 and extracted from, say, coil 22, by a capacitive or inductive coupling, will have a frequency which is a function of acceleration. By applying this voltage to a calibrated frequency meter or digital counter, direct readings of acceleration may be obtained.

Figures 9, 10, 11:
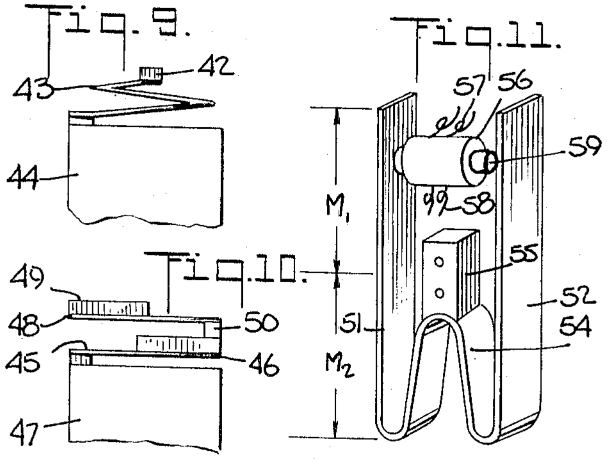
FIG. 9 is a compensator having an accordion spring arrangement adapted in some instances to produce overcompensation.
FIG. 10 is another version of a compensated vibrator.
FIG. 11 shows a fork structure which is substantially immune to shock and vibration.

To accomplish the overcompensation, the weight 41, as shown in FIG. 9, is mounted at the free end of a spring 42 of accordion construction, the other end being secured to pedestal 43 mounted on one side of the end of tine or reed 44. A change in position will result in a large displacement of weight 42 with respect to the end of the tine, the direction of displacement depending, of course, on whether the reed is up or down. The resultant change in reed frequency will be far greater than that necessary to counterbalance the change in reed frequency in response to a change in position.

In FIG. 10, a similar effect is obtained by two stacked compensators, one of which, composed of spring 45 and weight 46, is mounted on tine 47, and the other composed of spring 48 and weight 49, mounted by pedestal 50 on weight 46. Over-compensation can also be effected by the structures shown in FIGS. 1 to 8 by appropriate parameters of springs and mass.

Referring now to FIG. 11, there is shown an internal stud fork assembly having a substantially increased immunity to external shock and vibration. The fork, generally designated by the numeral 51, is fabricated from a ribbon of low-coefficient alloy, such as Ni-Span C or Vibralloy. The ribbon is shaped so as to form tines 52 and 53 which are joined to a base having a reverse bend forming a hump 54 to which a mounting block 55 is attached, as by welding.

Located between tines 52 and 53 is a bobbin 56 containing a pick-up coil terminating in leads 57 and a drive coil terminating in leads 58. Inside the bobbin is an axially polarized magnet 59. When the pick-up coil and drive coil leads are connected to an electronic circuit, as in FIG. 1, the fork will be caused to vibrate. The fork is provided with compensators (not shown) of the type disclosed in the previous figures and for the same purpose.

The fork arrangement is such that its point of support lies at the midpoint of moments $M_1$ and $M_2$ to afford substantial immunity from shock and vibration. By locating the drive and pick-up coils between the tines, the effects of shock and vibration on the generated signals are further reduced.

Under external shock and vibrations which tend to move the tines in phase, signals due to such spurious motion substantially cancel out. The reverse bend 54 provides a mounting point for the fork away from normal tine motion and obviates the need to ideally support the fork at its two nodal points, which vary in location according to tine length. This is awkward when a variety of lengths are manufactured. The fork configuration has the advantage also of small size and low cost.

While there have been shown preferred embodiments of attitude-compensated electromechanical oscillators in accordance with the invention, it will be appreciated that many changes and modifications may be made therein without, however, departing from the essential spirit of the invention as defined in the annexed claims.

What is claimed is:

1. In an oscillator having a vibrating rod which acts to control the frequency thereof, a compensator constituted by a spring attached to one end of said rod, and a weight at the end of said spring which shifts in position relative to said rod to vary the frequency of said oscillator in a direction opposed to variations resulting from changes in attitude and acceleration.

2. An accelerometer including an oscillator, as set forth in claim 1 and further including means to measure the frequency of said oscillator and calibrated in terms of acceleration.

3. A compensated tuning fork oscillator comprising a tuning fork having a pair of tines, electromagnetic means coupled to said tines to maintain said fork in vibration, and a compensator coupled to at least one of said tines and constituted by a weighted body one end of which is secured to a flat spring, the other end of said spring being secured to the end of said tine whereby the weighted body in response to a change in fork attitude shifts in position relative to said tine to cause a change in the frequency of said fork in a direction opposed to the frequency change otherwise resulting from a change in attitude.

4. An oscillator as set forth in claim 3 wherein the parameters of said compensator are such as to cancel out the frequency change in said oscillator resulting from a change in attitude to render said oscillator insensitive to changes in attitude.

5. An oscillator as set forth in claim 3, wherein the parameters of said compensator are such as to compensate for the frequency change in said oscillator resulting from a change in attitude to render said oscillator more sensitive to changes in attitude, and means to measure the frequency of said oscillator to provide attitude readings.

6. An oscillator as set forth in claim 3, including means to mount said fork at an intermediate point at which the moment to one side of said point effectively cancels out the moment to the other side of said point to render said fork substantially immune to external shock and vibration.

7. A tuning fork oscillator comprising a tuning fork having a pair of tines, an electronic drive circuit for sustaining said fork in oscillation and including drive and pickup coils associated with said tines, and a compensator mounted on the end of each tine, each compensator including a flat spring, a pedestal secured to the tine, one end of said spring being affixed to said pedestal, and a weight secured to the other end of said spring, said weight shifting relative to said tine in response to changes in attitude and acceleration.

8. An oscillator as set forth in claim 7, including means to adjust the position of said spring relative to said pedestal to vary the compensating effect of said weight.

9. A compensated tuning fork oscillator comprising a tuning fork having a pair of tines, means to sustain said fork in vibration, and a compensator on at least one of said tines constituted by a pedestal attached to the end of said tine, a flat spring mounted symmetrically about said pedestal, and a weight on either end of said spring, the two weights shifting in a direction compensating for changes in the frequency of the oscillator resulting from changes in attitude and acceleration.

10. A compensated tuning fork oscillator comprising a tuning fork having a pair of tines, means to sustain said fork in vibration, and a compensator on at least one of said tines constituted by a pedestal attached to the end of said tine, a flat spring in a zig-zag configuration, one end of the spring being attached to the pedestal, and a weight secured to the other end of the spring.

11. An oscillator as set forth in claim 10, including additional weights attached at intermediate points on said spring.

12. A tuning fork oscillator comprising a tuning fork having a pair of tines joined by a base having a reverse bend to form a hump, and means attached to the peak of said hump to mount said fork whereby the moment at one side of said mounting balances out the moment at the other side thereof, and a compensator attached to at least one tine and constituted by a weighted body one end of which is secured to a flat spring, the other end of the spring being secured to the end of said tine whereby the weighted body in response to a change in fork attitude shifts in position relative to said tine to cause a change in the frequency of said fork in a direction opposed to the frequency change resulting from a change in attitude.

13. A tuning fork oscillator, as set forth in claim 12, further including electromagnetic means positioned between said tines to drive said fork.

References Cited by the Examiner

UNITED STATES PATENTS

| | | | |
|---|---|---|---|
| 1,975,516 | 10/1934 | Nicolson | 73—382 |
| 2,433,160 | 12/1947 | Rusler | 84—409 |
| 2,928,668 | 3/1960 | Blasingame | 73—517 |

RICHARD C. QUEISSER, *Primary Examiner.*

JAMES J. GILL, *Examiner.*